(12) United States Patent
Imai (10) Patent No.: US 6,337,248 B1
(45) Date of Patent: Jan. 8, 2002

(54) PROCESS FOR MANUFACTURING SEMICONDUCTOR DEVICES

(75) Inventor: Kiyotaka Imai, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/377,047

(22) Filed: Aug. 19, 1999

(30) Foreign Application Priority Data

Aug. 28, 1998 (JP) .............................. 10-244049

(51) Int. Cl.⁷ .................... H01L 21/336; H01L 21/8234
(52) U.S. Cl. ..................... 438/279; 438/199; 438/217; 438/275; 438/289
(58) Field of Search ............................... 438/279, 275, 438/200, 199, 217, 289, 291

(56) References Cited

U.S. PATENT DOCUMENTS

| | | | | |
|---|---|---|---|---|
| 5,432,114 A | * | 7/1995 | O .................................. | 438/217 |
| 5,468,666 A | * | 11/1995 | Chapman .................... | 257/408 |
| 5,953,599 A | * | 9/1999 | El-Diwany ................... | 438/275 |

FOREIGN PATENT DOCUMENTS

| | | |
|---|---|---|
| JP | 61-174664 | 8/1986 |
| JP | 63-156352 | 6/1988 |
| JP | 5-56022 | 8/1993 |
| JP | 7-153847 | 6/1995 |
| JP | 7-321220 | 12/1995 |
| JP | 8-167655 | 6/1996 |
| JP | 8-204023 | 8/1996 |

OTHER PUBLICATIONS

Minami et al, English abstract of JP–4–08–167655, Jun. 15, 1996.*

* cited by examiner

*Primary Examiner*—Michael Trinh
(74) *Attorney, Agent, or Firm*—Sughrue Mion, PLLC (57) ABSTRACT

Manufactured is a semiconductor device that has a substrate and a surface channel nMOS and a buried channel nMOS as well as a surface channel pMOS and a buried channel pMOS formed on the substrate. An n⁺ dopant is introduced prior to patterning a polycrystalline semiconductor layer that forms respective gate electrodes of the surface channel nMOS and the buried channel pMOS. A p⁺ dopant is also introduced prior to patterning a polycrystalline semiconductor layer that forms respective gate electrodes of the surface channel pMOS and the buried channel nMOS.

5 Claims, 6 Drawing Sheets

PROCESS FOR MANUFACTURING SEMICONDUCTOR DEVICES

BACKGROUND OF THE INVENTION

1. Field of the Invention

The present invention relates to a process for manufacturing a semiconductor device and more particularly to a process for manufacturing a semiconductor device that has a substrate and surface channel and buried channel insulated gate field effect transistors of a first conductive type and surface channel and buried channel insulated gate field effect transistors of a second conductive type formed on the substrate.

2. Description of the Related Art

MOSFETs have channel structures of the surface channel and buried channel types. The surface channel type is used for both nMOSs and pMOSs in a CMOS process for digital circuits because it is relatively easy to suppress its short channel effect. In the surface channel MOS, however, carriers are scattered in an interface between a silicon substrate and an oxide film, causing relatively high levels of noise. On the other hand, in the buried channel MOS, a channel is formed within a silicon substrate to lower the level of noise. Therefore, the buried channel type is more suitable for analog circuits than the surface channel type.

Important structural differences between the surface channel MOS and the buried channel MOS will be described below. In the surface channel type, there is a difference in dopant type between a substrate or well region and a polysilicon gate electrode. On the other hand, in the buried channel type, there is no difference in dopant type between a substrate or well region and a polysilicon gate electrode. For example, in the surface channel nMOS, a well region is of the p type and a polysilicon gate electrode is of the $n^+$ type. On the other hand, in the buried channel nMOS, a well region is of the p type and a polysilicon gate electrode is of the $p^+$ type.

FIGS. 5A–5C and 6D–6F show conventional process steps for manufacturing the surface channel MOS and buried channel MOS in the art.

Figure 5A:
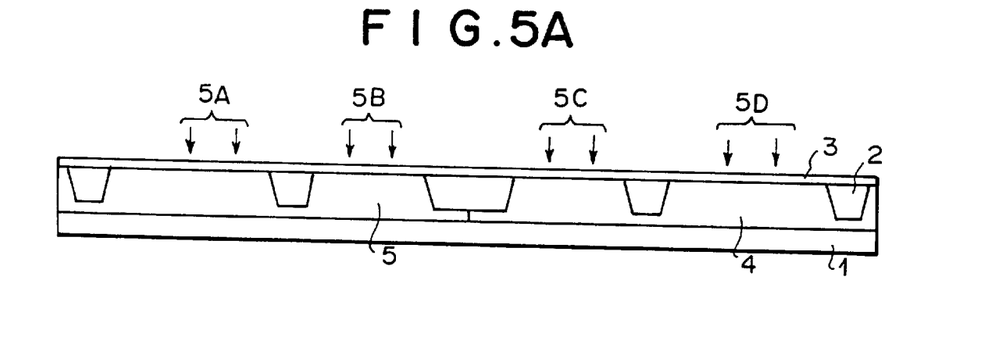
FIGS. 5A–5C are cross sectional views showing process steps for manufacturing surface channel MOSs and buried channel MOSs according to a conventional method.

As shown in FIG. 5A, device isolation regions 2 are formed on a p-type silicon substrate 1 and a sacrificial oxide film 3 is grown thereon. Then, a p well 4 is formed within an nMOS-forming region; an n well 5, within a pMOS-forming region.

First boron implantation for controlling a threshold level is performed into a surface channel nMOS-forming region on the p well 4 to make the region into a more positive region in terms of dopant concentrations in order to form an nMOS surface channel region 6. First arsenic implantation for controlling a threshold level is performed into a surface channel pMOS-forming region on the n well 5 to make the region into a more negative region in terms of dopant concentrations in order to form a pMOS surface channel region 7 as well.

Second arsenic implantation for controlling a threshold level is performed into a buried channel nMOS-forming region on the p well 4 to form an nMOS buried channel region 8 at a depth of 50–150 nm beneath the silicon surface by inverting the p well 4 into an n-type region. Second boron implantation for controlling a threshold level is performed into a buried channel pMOS-forming region on the n well 5 to form a pMOS buried channel region 9 at a depth of 50–150 nm beneath the silicon surface as well by inverting the n well 5 into a p-type region.

Figure 5B:
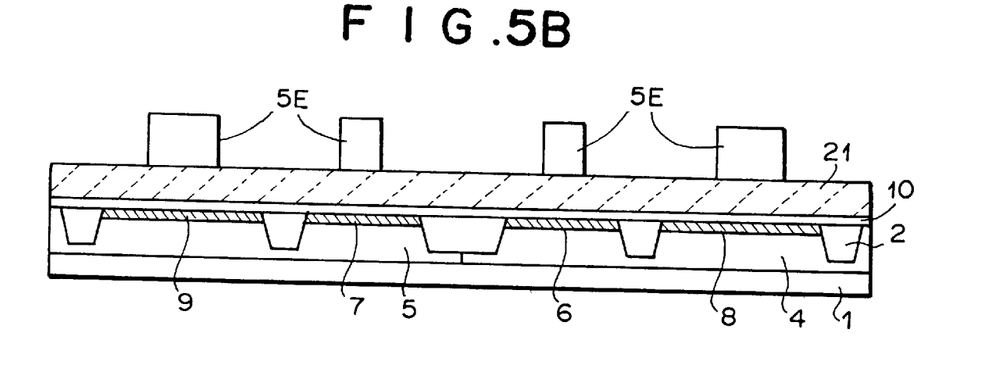

As shown in FIG. 5B, after removing of the sacrificial oxide film 3, a gate oxide film 10 is grown, a non-doped polysilicon 21 is further grown and then a resist is patterned by photolithography.

Figure 5C:
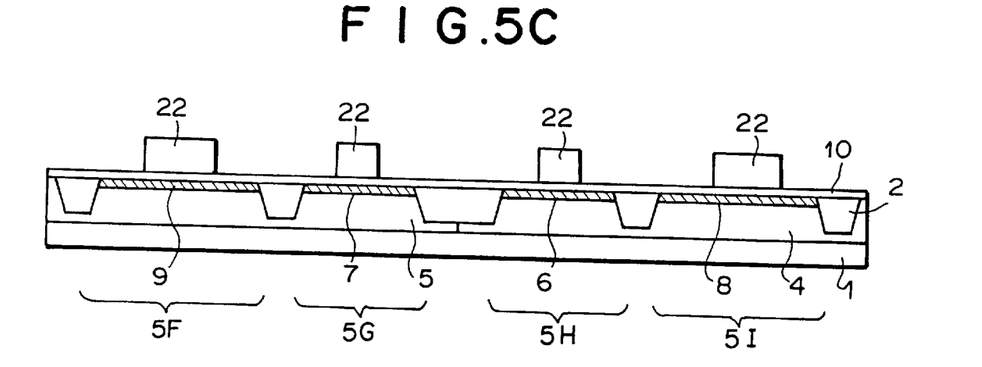

Next, the non-doped polysilicon 21 is etched to form non-doped polysilicon electrodes 22 as shown in FIG. 5C.

Figure 6D:
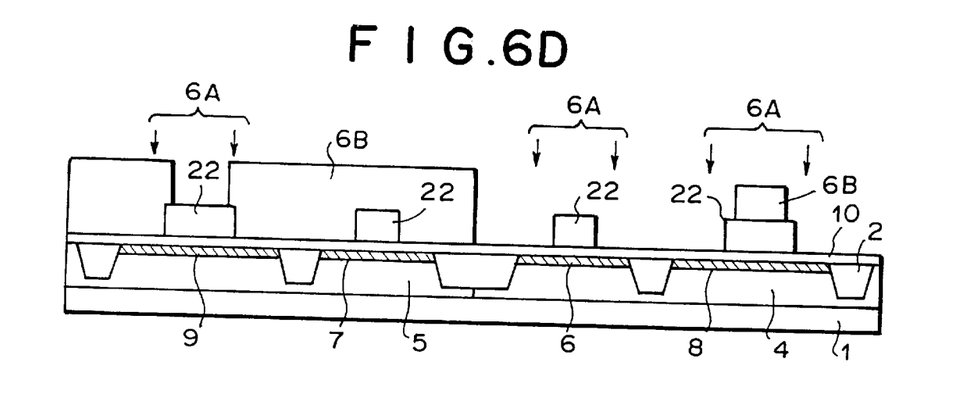
FIGS. 6D–6F are cross sectional views showing process steps for manufacturing surface channel MOSs and buried channel MOSs according to a conventional method.

As shown in FIG. 6D, SD (source/drain)-arsenic is selectively implanted into the non-doped polysilicon electrode 22 and diffused layer-forming region of the surface channel nMOS, the diffused layer-forming region of the buried channel nMOS and the non-doped polysilicon electrode 22 of the buried channel pMos.

A resist that covers the non-doped polysilicon electrode 22 of the buried channel nMOS is located inwardly by a certain margin from the edge of the non-doped polysilicon electrode 22 so that $n^+$ source/drain regions 18 may not be offset from the non-doped polysilicon electrode 22.

A resist that covers the diffused layer of the buried channel pMOS is also located inwardly by a certain margin from the edge of the non-doped polysilicon electrode 22 so that implanted SD-arsenic may not reach the diffused layer.

Figure 6E:
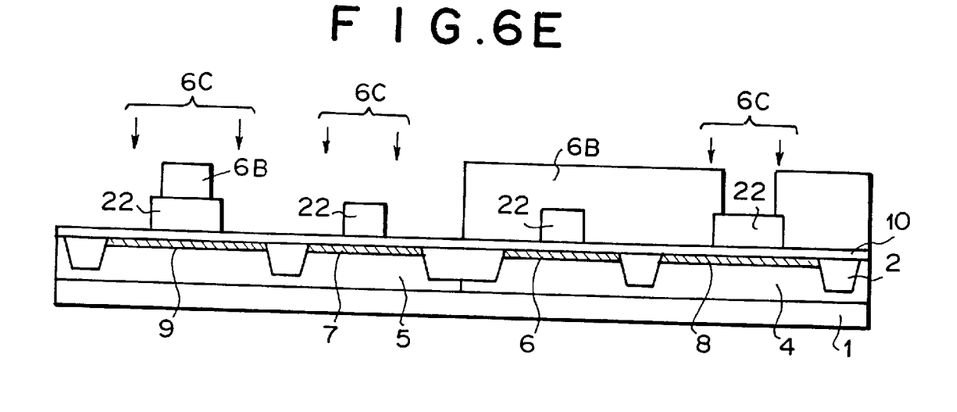

As shown in FIG. 6E, SD-boron is selectively implanted into the non-doped polysilicon electrode 22 and diffused layer-forming region of the surface channel pMOS, the diffused layer-forming region of the buried channel pMOS and the non-doped polysilicon electrode 22 of the buried channel nMOS.

A resist that covers the non-doped polysilicon electrode 22 of the buried channel pMOS is located inwardly by a certain margin from the edge of the non-doped polysilicon electrode 22 so that $p^+$ source/drain regions 19 may not be offset from the non-doped polysilicon electrode 22.

A resist that covers the diffused layer of the buried channel nMOS is also located inwardly by a certain margin from the edge of the non-doped polysilicon electrode 22 so that implanted SD-boron may not reach the diffused layer.

Figure 6F:
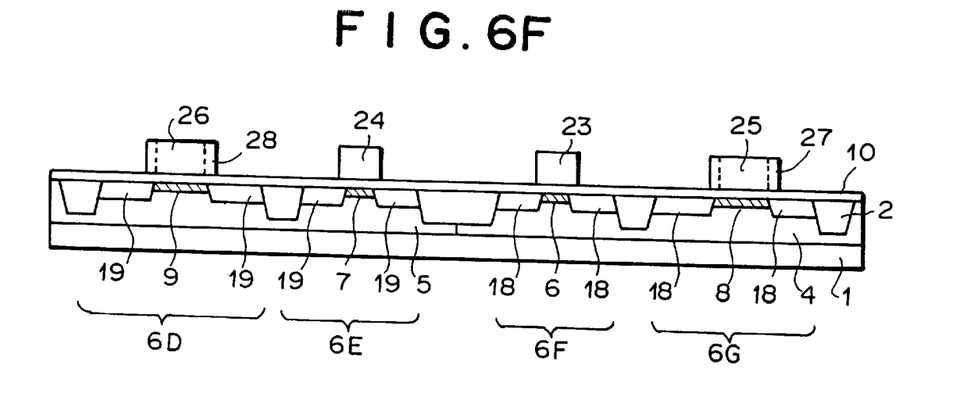

Next, the arsenic and boron are heated to activate as shown in FIG. 6F.

The activation leads to the formation of the $n^+$ source/drain regions 18 of the surface channel nMOS and buried channel nMOS and the $p^+$ source/drain regions 19 of the surface channel pMOS and buried channel pMOS. The non-doped polysilicon electrode 22 of the surface channel nMOS becomes an $n^+$ polysilicon gate electrode 23 with added SD-arsenic. The non-doped polysilicon electrode 22 of the surface channel pMOS becomes a $p^+$ polysilicon gate electrode 24 with added SD-boron. The non-doped polysilicon electrode 22 of the buried channel nMOS becomes a $p^+$ polysilicon gate electrode 25 with added SD-boron. The non-doped polysilicon electrode 22 of the buried channel pMOS becomes an $n^+$ polysilicon gate electrode 26 with added SD-arsenic.

A conventional method for manufacturing the surface channel MOS and buried channel MOS is disclosed as mentioned above. As shown in FIG. 6F, however, there are regions into which SD-arsenic is implanted but SD-boron is not implanted at both ends of the $p^+$ polysilicon gate electrode 25 of the buried channel nMOS. The regions become, after heat treatment, $p^-$ polysilicon regions 27 with relatively low concentrations of p-type dopant because boron atoms diffused from the central portion of the SD-boron-implanted gate polysilicon compensate SD-arsenic-implanted portions. Similarly, there are n polysilicon regions 28 with relatively low concentrations of n-type dopant at both ends of the $n^+$ polysilicon gate electrode 26 of the buried channel pMOS.

In the buried channel nMOS, a p⁻ polysilicon region 27 of low dopant concentration originally differs in work function from a p⁺ polysilicon gate electrode 25 of originally high dopant concentration. As a result, the central portion of the transistor, which is covered with the p⁺ polysilicon electrode 25, disadvantageously differs in threshold level from the edge portion of the transistor, which is covered with the p⁺ polysilicon region 27. A sheet resistance of the whole gate polysilicon electrode may be larger than that of a gate polysilicon electrode consisting only of the p⁺ polysilicon electrode 24 on the surface channel pMOS. If silicide formation is performed to lower the sheet resistances of gate polysilicon electrodes and diffused layers, the polysilicon electrodes with different concentrations of a dopant are difficult to silicify uniformly because the silicide formation reaction between a metal and silicon depends greatly on the concentration of a dopant present in silicon. The above-mentioned disadvantages also apply to the buried channel pMOS.

Japanese Patent Publication No.5-56022 discloses a technique to make the conductive type of a gate electrode of the buried channel MOS transistor into the opposite conductive type to that of the channel type. Japanese Patent Application Laid-open No.61-174664 discloses a process comprising forming a p-type dopant-introduced polysilicon layer throughout the surface, patterning the layer to form gate electrodes, then implanting arsenic ions as the n-type dopant for forming source/drain regions of an n-channel MOS transistor, and implanting arsenic ions as the p-type dopant for forming source/drain regions of a p-channel MOS transistor, so that these regions are converted into the buried channel type and the surface channel type, respectively.

SUMMARY OF THE INVENTION

Accordingly, it is an object of the present invention is to provide a process for manufacturing a semiconductor device that has a substrate and surface channel and buried channel insulated gate field effect transistors of a first conductive type and surface channel and buried channel insulated gate field effect transistors of a second conductive type formed on the substrate.

The process comprises introducing a dopant of the first conductive type prior to pattering a polycrystalline semiconductor layer that forms respective gate electrodes of the surface channel insulated gate field effect transistor of the first conductive type and the buried channel insulated gate field effect transistor of the second conductive type. The process further comprises introducing a dopant of the second conductive type prior to pattering a polycrystalline semiconductor layer that forms respective gate electrodes of the surface channel insulated gate field effect transistor of the second conductive type and the buried channel insulated gate field effect transistor of the first conductive type.

Other features and advantages of the invention will be apparent from the following description of the preferred embodiments thereof.

BRIEF DESCRIPTION OF THE DRAWINGS

The present invention will be more fully understood from the following detailed description with reference to the accompanying drawings.

1A: SECOND BORON IMPLANTATION
1B: FIRST ARSENIC IMPLANTATION
1C: FIRST BORON IMPLANTATION
1D: SECOND ARSENIC IMPLANTATION
1E: PHOSPHOROUS IMPLANTATION FOR POLY-SILICON DOPING
1F: RESIST
1G: BURIED CHANNEL pMOS
1H: SURFACE CHANNEL pMOS
1I: SURFACE CHANNEL nMOS
1J: BURIED CHANNEL nMOS

2A: SD-ARSENIC IMPLANTATION
2B: RESIST
2C: SD-BORON IMPLANTATION
2D: BURIED CHANNEL pMOS
2E: SURFACE CHANNEL pMOS
2F: SURFACE CHANNEL nMOS
2G: BURIED CHANNEL nMOS

3A: SECOND BORON IMPLANTATION
3B: FIRST ARSENIC IMPLANTATION
3C: FIRST BORON IMPLANTATION
3D: SECOND ARSENIC IMPLANTATION
3E: PHOSPHOROUS IMPLANTATION
3F: RESIST
3G: BURIED CHANNEL pMOS
3H: SURFACE CHANNEL pMOS
3I: SURFACE CHANNEL nMOS
3J: BURIED CHANNEL nMOS

4A: SD-ARSENIC IMPLANTATION
4B: RESIST
4C: SD-BORON IMPLANTATION
4D: BURIED CHANNEL pMOS
4E: SURFACE CHANNEL pMos
4F: SURFACE CHANNEL nMOS
4G: BURIED CHANNEL nMOS

5A: SECOND BORON IMPLANTATION
5B: FIRST ARSENIC IMPLANTATION
5C: FIRST BORON IMPLANTATION
5D: SECOND ARSENIC IMPLANTATION
5E: RESIST
5F: BURIED CHANNEL pMOS
5G: SURFACE CHANNEL pMOS
5H: SURFACE CHANNEL nMOS
5I: BURIED CHANNEL nMOS

6A: SD-ARSENIC IMPLANTATION
6B: RESIST
6C: SD-BORON IMPLANTATION
6D: BURIED CHANNEL pMOS
6E: SURFACE CHANNEL pMOS
6F: SURFACE CHANNEL nMOS
6G: BURIED CHANNEL nMOS

DETAILED DESCRIPTION OF THE PREFERRED EMBODIMENTS

Embodiments of the present invention will be described below with reference to the drawings. MOS transistors will be exemplified as insulated gate transistors (MIS transistors) in the following embodiments.

FIRST EMBODIMENT

FIGS. 1A–1C and 2D–2F are cross sectional views showing process steps for manufacturing surface channel MOSs and buried channel MOSs according to the FIRST EMBODIMENT of the present invention.

Figure 2D:
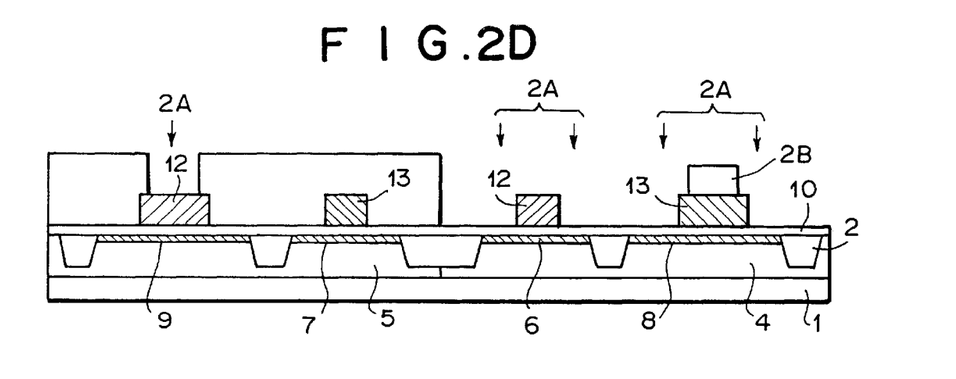
FIGS. 2D–2F are cross sectional views showing process steps for manufacturing surface channel MOSs and buried channel MOSs according to the FIRST EMBODIMENT of the present invention.
Figure 2E:
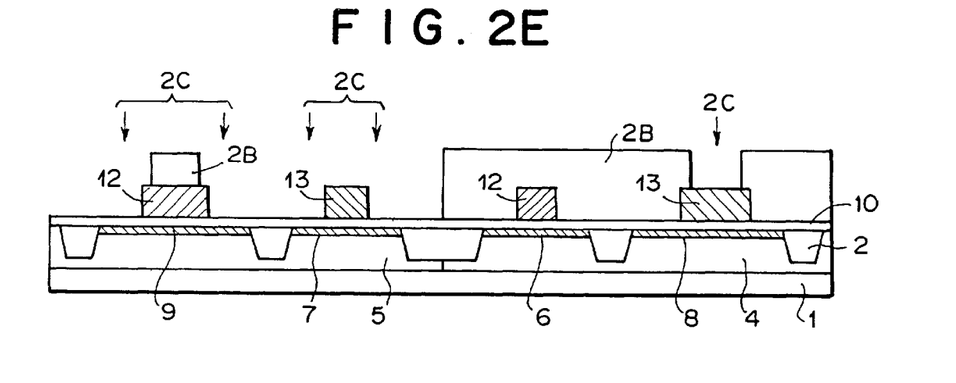
Figure 2F:
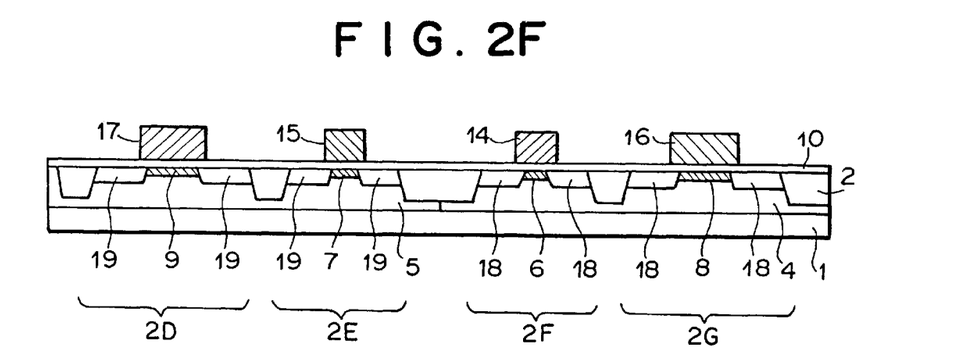

FIG. 2F shows a cross sectional view of a product in a case where a surface channel nMOS and a surface channel pMOS as well as a buried channel nMOS and a buried channel pMOS are formed on a substrate according to the process of the present invention.

As shown in FIG. 2F, device isolation regions 2 are formed on a p-type silicon substrate 1. The substrate also has a p well 4 in an nMOS-forming region, an n well 5 in a pMOS-forming region, and a gate insulating film 10 thereon.

The surface channel nMOS has a structure in which a surface channel region 6 is formed in the surface of the p well 4; the gate insulating film 10 and an $n^+$ polysilicon gate electrode 14, on the surface channel region 6; $n^+$ source/drain regions 18, in a diffused layer.

The surface channel pMos has a structure in which a surface channel region 7 is formed in the surface of the n well 5; the gate insulating film 10 and a $p^+$ polysilicon gate electrode 15, on the surface channel region 7; $p^+$ source/drain regions 19, in a diffused layer.

The buried channel nMOS has a structure in which a buried channel region 8 is formed in the surface of the p well 4; the gate insulating film 10 and a $p^+$ polysilicon gate electrode 16, on the buried channel region 8; $n^+$ source/drain regions 18, in a diffused layer.

The buried channel pMOS has a structure in which a buried channel region 9 is formed in the surface of the n well 5; the gate insulating film 10 and an $n^+$ polysilicon gate electrode 17, on the buried channel region 9; $p^+$ source/drain regions 19, in a diffused layer.

A process for manufacturing surface channel MOSs and buried channel MOSs of the present invention will be described below with reference to FIGS. 1A–1C and 2D–2F.

Figure 1A:
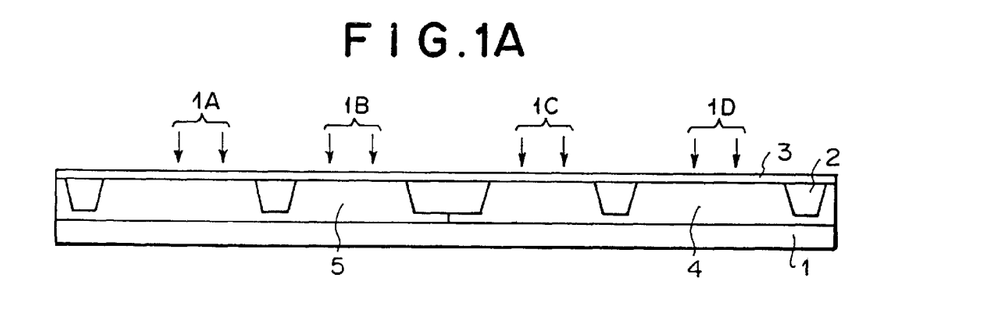
FIGS. 1A–1C are cross sectional views showing process steps for manufacturing surface channel MOSs and buried channel MOSs according to the FIRST EMBODIMENT of the present invention.

As shown in FIG. 1A, device isolation regions 2 are formed on a p-type silicon substrate 1 and a sacrificial oxide film 3 is grown thereon. Then, a p well 4 is formed within an nMOS-forming region; an n well 5, within a pMOS-forming region.

First boron implantation for controlling a threshold level is performed into a surface channel nMOS-forming region on the p-well 4 to convert the region into a more positive region in terms of dopant concentrations and to form an nMOS surface channel region 6. First arsenic implantation for controlling a threshold level is performed into a surface channel pMOS-forming region on the n well 5 and to convert the region into a more negative region and to form a pMOS surface channel region 7 as well.

Second arsenic implantation for controlling a threshold level is performed into a buried channel nMOS-forming region on the p well 4 to form an nMOS buried channel region 8 at a depth of 50–150 nm beneath the silicon surface by inverting the p well 4 into an n-type region. Second boron implantation for controlling a threshold level is performed into a buried channel pMOS-forming region on the n well 5 to form a pMOS buried channel region 9 at a depth of 50–150 nm beneath the silicon surface by inverting the n well 5 into a p-type region as well.

Figure 1B:
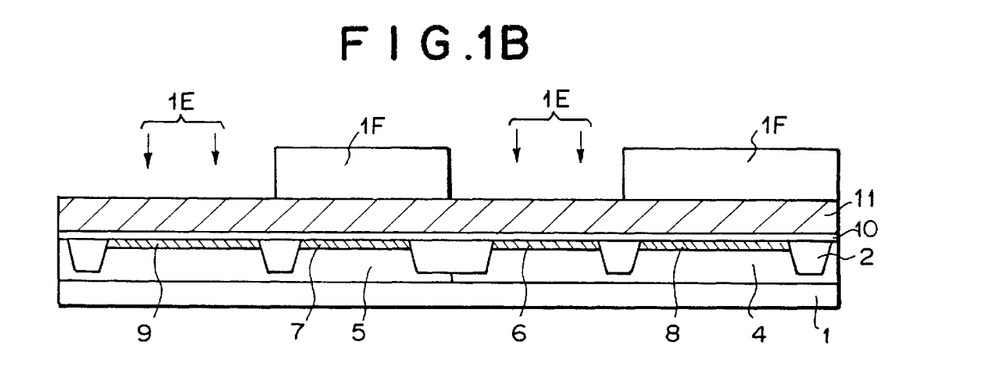

As shown in FIG. 1B, after removal of the sacrifice oxide film 3, a gate oxide film 10 is grown and further a boron-doped polysilicon 11 is grown. Thereafter, pattering is carried out in a resist by photolithography and then phosphorous ions are selectively implanted into the boron-doped polysilicon 11 over the surface channel nMOS region and the boron-doped polysilicon 11 over the buried channel pMOS region. If the boron concentration of the boron-doped polysilicon 11 is $1 \times 10^{20}/cm^3$, phosphorous ions may be implanted at $5 \times 10^{15}/cm^2$ to invert the phosphorous-implanted portion into an $n^+$ type region.

Figure 1C:
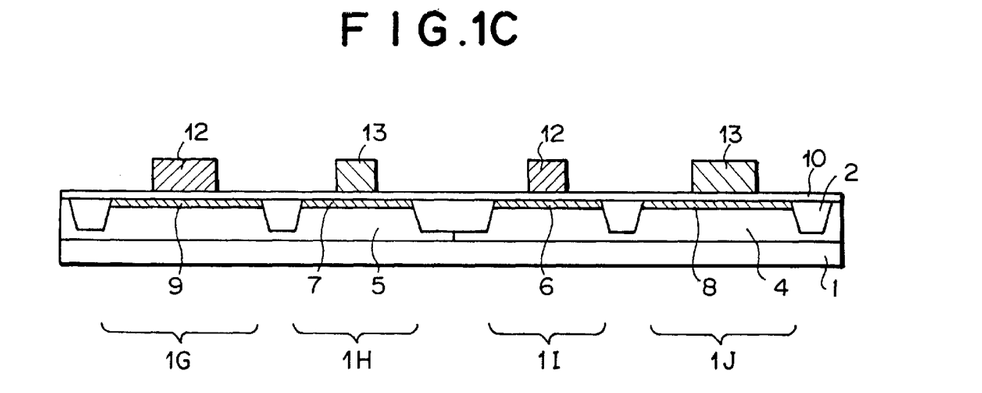

Next, as shown in FIG. 1C, the polysilicon 11 is etched to form gate electrodes. In this case, phosphorous-doped polysilicon gate electrodes 12 are formed in the surface channel nMOS region and the buried channel pMos region; boron-doped polysilicon gate electrodes 13, in the surface channel pMOS region and the buried channel nMOS region, respectively.

As shown in FIG. 2D, SD-arsenic is selectively implanted into the phosphorous-doped polysilicon electrode 12 and a diffused layer-forming region of the surface channel nMOS, a diffused layer-forming region of the buried channel nMOS and a phosphorous-doped polysilicon electrode 12 of the buried channel pMOS.

A resist that covers the boron-doped polysilicon electrode 13 of the buried channel nMOS (serves as a shield film that prevents the implantation of ions into the gate electrode) is located inwardly by a certain margin from the edge of the boron-doped polysilicon electrode 13 so that $n^+$ source/drain regions 18 may not be offset from the boron-doped polysilicon electrode 13.

A resist that covers the diffused layer of the buried channel pMOS is located inwardly by a certain margin from the edge of the phosphorous-doped polysilicon electrode 12 so that implanted SD-arsenic may not reach the diffused layer.

As shown in FIG. 2E, SD-boron is selectively implanted into the boron-doped polysilicon electrode 13 and a diffused layer-forming region of the surface channel pMOS, a diffused layer-forming region of the buried channel pMOS and the boron-doped polysilicon electrode 13 of the buried channel nMOS.

A resist that covers the phosphorous-doped polysilicon electrode 12 of the buried channel pMOS (serves as a shield film that prevents the implantation of ions into the gate electrode) is located inwardly by a certain margin from the edge of the phosphorous-doped polysilicon electrode 12 so that $p^+$ source/drain regions 19 may not be offset from the phosphorous-doped polysilicon electrode 12.

A resist that covers the diffused layer of the buried channel nMOS is located inwardly by a certain margin from the edge of the boron-doped polysilicon electrode 13 so that implanted SD-boron may not reach the diffused layer.

Next, the arsenic and boron are heated to activate as shown in FIG. 2F.

This activation leads to the formation of the n$^+$ source/drain regions 18 of the surface channel nMOS and buried channel nMOS and the p$^+$ source/drain regions 19 of the surface channel pMOS and buried channel pMOS. The phosphorous-doped polysilicon electrode 12 of the surface channel nMOS becomes an n$^+$ polysilicon gate electrode 14 with added SD-arsenic. The boron-doped polysilicon electrode 13 of the surface channel pMOS becomes a p$^+$ polysilicon gate electrode 15 with added SD-boron. The boron-doped polysilicon electrode 13 of the buried channel nMOS becomes a p$^+$ polysilicon gate electrode 16 with added SD-boron. The phosphorous-doped polysilicon electrode 12 of the buried channel pMOS becomes an n$^+$ polysilicon gate electrode 17 with added SD-arsenic.

There are also regions into which SD-arsenic is implanted but SD-boron is not implanted at both ends of the p$^+$ polysilicon gate electrode 16 of the buried channel nMOS in the process of the present embodiment as well as in the conventional process. These regions can, however, maintain to be of the p$^+$ type because boron was previously doped therein. Therefore, there may be no difference in threshold level between the center and the end portions of the gate electrode as observed in the conventional process. In addition, there may be no increase in sheet resistance. Further, there may not be disadvantages in suicide formation. The similar results also apply to the n$^+$ polysilicon gate electrode 17 of the buried channel pMOS.

The concentration of an n-type dopant present in the n$^+$ polysilicon gate electrode 14 of the surface channel nMOS is larger than that of the prior art. As a result, when applying positive voltage between the n$^+$ polysilicon gate electrode 14 and the p well 4 to form an inverted layer, a depletion layer can be reduced in width that extends from the interface between the gate insulating film 10 and the n$^+$ polysilicon gate electrode 14 into the polysilicon electrode.

SECOND EMBODIMENT

FIGS. 3A–3C and 4D–4F are cross sectional views showing process steps for manufacturing surface channel MOSs and buried channel MOSs according to the SECOND EMBODIMENT of the present invention.

Figure 3A:
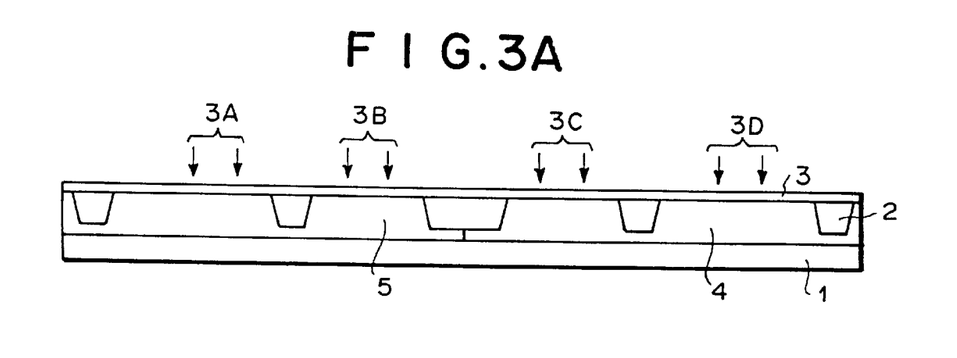
FIGS. 3A–3C are cross sectional views showing process steps for manufacturing surface channel MOSs and buried channel MOSs according to the SECOND EMBODIMENT of the present invention.

A process step shown in FIG. 3A is performed according to the same procedure as that in FIG. 1A.

Figure 3B:
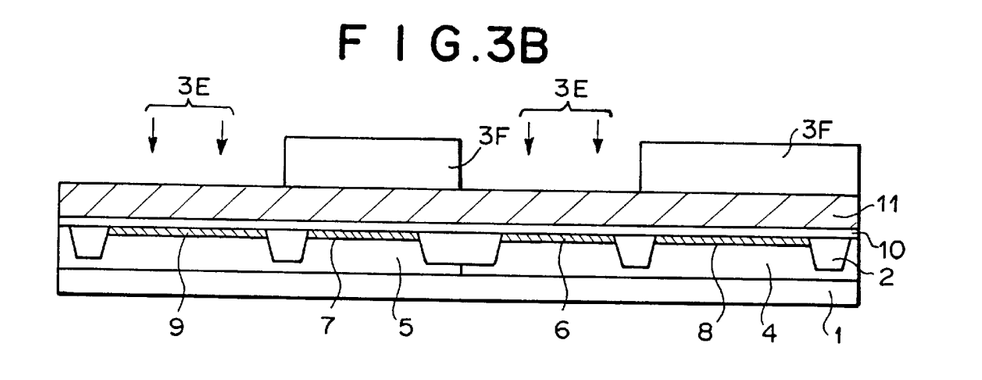

As shown in FIG. 3B, after removal of a sacrifice oxide film 3, a gate oxide film 10 is grown and further a boron-doped polysilicon 11 is grown. Thereafter, a resist is patterned by photolithography and then phosphorous is selectively implanted into the boron-doped polysilicon 11 on the surface channel nMOS region and the boron-doped polysilicon 11 on the buried channel pMOS region. The boron concentration of the boron-doped polysilicon 11 is set at $2 \times 10^{20}/cm^3$ higher than that of the FIRST EMBODIMENT, and the dose of implanted phosphorous is also set as high as $1 \times 10^{16}/cm^2$.

Figure 3C:
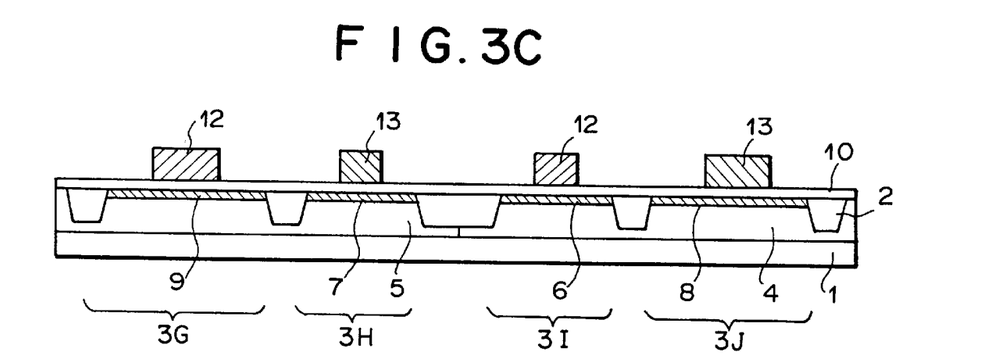

Next, as shown in FIG. 3C, the polysilicon 11 is etched to form gate electrodes, which are phosphorous-doped polysilicon gate electrodes 12 on the surface channel nMOS and buried channel pMOS and boron-doped polysilicon gate electrodes 13 on the surface channel pMOS and buried channel nMOS, respectively.

Figure 4D:
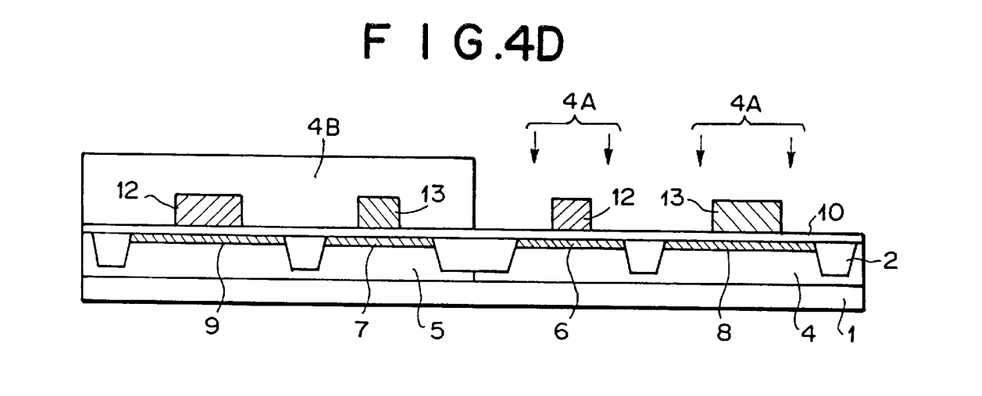
FIGS. 4D–4F are cross sectional views showing process steps for manufacturing surface channel MOSs and buried channel MOSs according to the SECOND EMBODIMENT of the present invention.

As shown in FIG. 4D, the whole surface of the surface channel pMOS and buried channel pMOS is covered with a resist, and then SD-arsenic is selectively implanted into the whole surface of the surface channel nMOS and buried channel nMOS. The dose of implanted SD-arsenic at this time is set at $2 \times 10^{15}/cm^2$ or less.

Figure 4E:
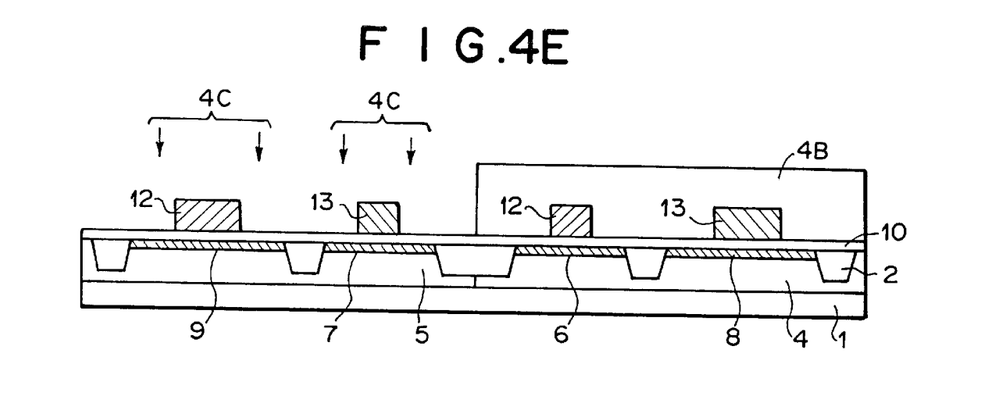

As shown in FIG. 4E, the whole surface of the surface channel nMOS and buried channel nMOS is covered with a resist, and then SD-boron is selectively implanted into the whole surface of the surface channel pMOS and buried channel pMOS. The dose of implanted SD-boron at this time is set at $2 \times 10^{15}/cm^2$ or less.

Figure 4F:
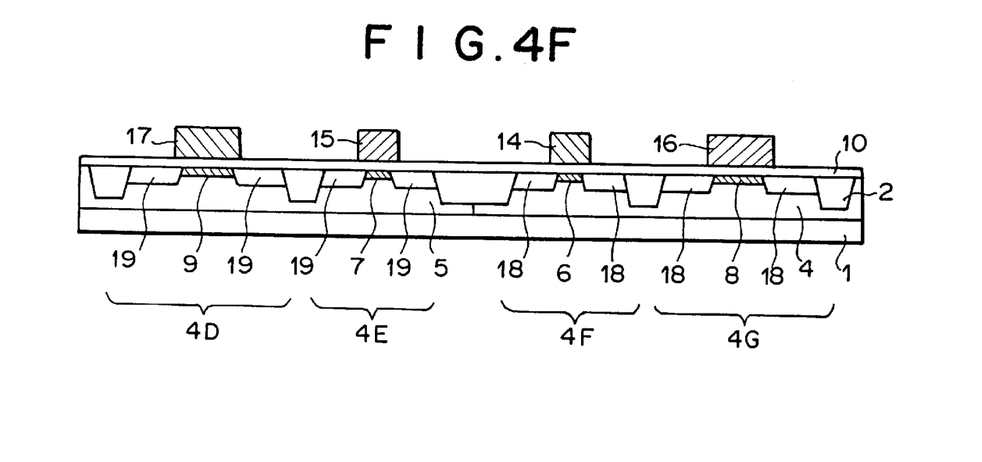

Next, the arsenic and boron are heated to activate as shown in FIG. 4F.

This activation leads to the formation of n$^+$ source/drain regions 18 of the surface channel nMOS and buried channel nMOS and p$^+$ source/drain regions 19 of the surface channel pMOS and buried channel pMOS. The phosphorous-doped polysilicon electrode 12 of the surface channel nMOS becomes an n$^+$ polysilicon gate electrode 14 with added SD-arsenic. The boron-doped polysilicon electrode 13 of the surface channel pMOS becomes a p$^+$ polysilicon gate electrode 15 with added SD-boron. The boron-doped polysilicon electrode 13 of the buried channel nMOS is provided with added SD-arsenic. However, since the concentration of boron originally doped is sufficiently higher than that of arsenic introduced by SD-arsenic implantation, thus the p$^+$ state of the electrode is maintained to realize a p$^+$ polysilicon gate electrode 16. The phosphorous-doped polysilicon electrode 12 of the buried channel pMOS is provided with. SD-boron. However, since the concentration of phosphorous originally doped is sufficiently higher than that of boron introduced by SD-boron implantation, thus the n$^+$ state of the electrode is maintained to realize an n$^+$ polysilicon gate electrode 17.

The above-described SECOND EMBODIMENT can advantageously produce a buried channel MOS with a fine gate length because it does not need to open a hole in a resist on a gate electrode or remain a resist on a gate electrode.

As described above, according to the present invention, it is possible to maintain the conductive type of a gate electrode even if a dopant whose conductive type is opposite to that of the gate electrode is introduced after it is formed. Thus, there is no difference in threshold level between the center and the end portions of a gate electrode and an increase in sheet resistance. Moreover, there is no problem in silicide formation.

In addition, the dose of a dopant present in a gate electrode of the surface channel nMOS is larger than that of the prior art. For example, when a positive voltage is applied between an n$^+$ polysilicon gate electrode and a p well to form an inverted layer, a depletion layer can be reduced in width that extends from an interface between a gate insulating film and an n$^+$ polysilicon gate electrode into the polysilicon gate electrode. As a result, a gate capacitance and an ON-state current can be increased.

As the embodiments consistent with the present invention have been described above, other embodiments and variations consistent with the present invention will be apparent to those skilled in the art. Therefore, the invention should not be viewed as limited to the disclosed embodiments but rather should be viewed as limited only by the spirit and scope of the appended claims.

What is claimed is:

1. A process for manufacturing a semiconductor device having a substrate and surface channel and buried channel insulated gate field effect transistors of a first conductive type and surface channel and buried channel insulated gate field effect transistors of a second conductive type formed on the substrate, comprising:

forming a polycrystalline semiconductor layer on a substrate;

introducing a dopant of said first conductive type prior to patterning said polycrystalline semiconductor layer forming respective gate electrodes of said surface channel insulated gate field effect transistor of said first conductive type and said buried channel insulated gate field effect transistor of said second conductive type; and introducing a dopant of said second conductive type prior to patterning said polycrystalline semiconductor layer forming respective gate electrodes of said surface channel insulated gate field effect transistor of said second conductive type and said buried channel insulated gate field effect transistor of said first conductive type.

2. The process according to claim 1, wherein said dopant of said first conductive type is an arsenic ion.

3. The process according to claim 1, wherein said dopant of said second conductive type is a boronic ion.

4. The process according to claim 1, further comprising:

forming said gate electrodes of said first and second conductive type; and forming a shield film on said gate electrodes to prevent implantation of dopant ions into said gate electrodes during implanting said dopant ions for forming source and drain regions of said buried channel insulated gate field effect transistors of said first and second conductive types.

5. The process according to claim 4, wherein said shield film is a resist.

* * * * *